United States Patent
Ottersten et al.

(10) Patent No.: US 11,063,653 B2
(45) Date of Patent: Jul. 13, 2021

(54) WIRELESS DEVICE FOR DETERMINING A BEST ANTENNA BEAM AND METHOD THEREOF

(71) Applicant: Telefonaktiebolaget LM Ericsson (publ), Stockholm (SE)

(72) Inventors: Johan Ottersten, Stockholm (SE); Maria Fresia, Stockholm (SE); Hugo Tullberg, Nyköping (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/630,765

(22) PCT Filed: Aug. 30, 2017

(86) PCT No.: PCT/SE2017/050865
§ 371 (c)(1),
(2) Date: Jan. 13, 2020

(87) PCT Pub. No.: WO2019/045606
PCT Pub. Date: Mar. 7, 2019

(65) Prior Publication Data
US 2020/0169311 A1    May 28, 2020

(51) Int. Cl.
*H04B 7/02*    (2018.01)
*H04B 7/06*    (2006.01)
(Continued)

(52) U.S. Cl.
CPC ........... *H04B 7/0695* (2013.01); *G06F 30/27* (2020.01); *H04B 7/0456* (2013.01)

(58) Field of Classification Search
CPC .... H04B 7/0695; H04B 7/0456; H04B 7/088; H04B 7/0617; G06F 30/27; G06N 3/08
(Continued)

(56) References Cited

U.S. PATENT DOCUMENTS

2009/0238156 A1* 9/2009 Yong .................... H04B 7/0491
370/336
2016/0353467 A1 12/2016 Nekovee et al.
(Continued)

FOREIGN PATENT DOCUMENTS

EP    2930966 A1    10/2015
EP    3646479 A0    1/2019
WO   2017092536 A1   6/2017

OTHER PUBLICATIONS

Yi-Tang Chiu et al., "Beam Selection and Power Allocation for Massive Connectivity in Millimeter Wave NOMA Systems," IEEE Access, Special selection on Millimeter communication: new Search Trends and Challenges, pp. 53868-53882.*
(Continued)

*Primary Examiner* — Tesfaldet Bocure
(74) *Attorney, Agent, or Firm* — Christopher & Weisberg, P.A.

(57) ABSTRACT

The present disclosure relates to a method for determining a best antenna beam. The method includes obtaining a training model, wherein the training model has been trained to provide a best antenna beam based on a plurality of feedback values, determining a first plurality of feedback values indicative of partial estimates of channels of a first plurality of wireless signals and determining a best antenna beam, based on the first plurality of feedback values and the obtained training model.

24 Claims, 10 Drawing Sheets

(51) Int. Cl.
G06F 30/27 (2020.01)
H04B 7/0456 (2017.01)
(58) Field of Classification Search
USPC .................. 375/267, 299, 347; 455/101, 132
See application file for complete search history.

(56) References Cited

U.S. PATENT DOCUMENTS

2017/0070269 A1 3/2017 Yamaura et al.
2017/0353260 A1 12/2017 Wang et al.
2019/0386726 A1* 12/2019 Fresia .................. H04B 7/0695

OTHER PUBLICATIONS

International Search Report and Written Opinion dated Mar. 21, 2018 for International Application No. PCT/SE2017/050865 filed on Aug. 30, 2017, consisting of 14-pages.
Meryem Simsek; Mehdi Bennis; Andreas Czylwik, "Coordinated beam selection in LTE-Advanced HetNets: A reinforcement learning approach"; 2012 IEEE Globecom workshops (GC wkshps 2012); Anaheim, California, USA; Dec. 3 7, 2012; Published Dec. 3, 2012; consisting of 5-pages.
Jiho Song, J unil Choi, and David J. Love; "Codebook Design for Hybrid Beamforming in Millimeter Wave Systems"; IEEE ICC 2015 SAC—Millimeter-wave Communications; consisting of 6-pages.
Shengli Zhou and Georgios B. Giannakis; Optimal Transmitter Eigen-Beamforming and Space-Time Block Coding Based on Channel Mean Feedback;IEEE Transactions on Signal Processing, vol. 50, No. 10, Oct. 2002; consisting of 15-pages.
Song Noh, Michael D. Zoltowski and David J. Love; Multi-Resolution Codebook and Adaptive; Beamforming Sequence Design for Millimeter Wave Beam Alignment; Feb. 15, 2017; consisting of 16-pages.
EPO Communication and Search Report dated Mar. 24, 2021 for International Application No. 17923308.5, consisting of 12-pages.
Bjorn Ekman; Machine Learning for Beam Based Mobility Optimization in NR; Master of Science Thesis in communication System; Department of electrical Engineering, Linkoping University, 2017, consisting of 85-pages.

* cited by examiner

Data Transmission Mode

At time instant $i$   At time instant $i + 1$

Best transmitter antenna beam $V_{i+i}$

Best receiver antenna beam $U_{i+i}$

WIRELESS DEVICE FOR DETERMINING A BEST ANTENNA BEAM AND METHOD THEREOF

CROSS-REFERENCE TO RELATED APPLICATIONS

This application is a Submission Under 35 U.S.C. § 371 for U.S. National Stage Patent Application of International Application Number: PCT/SE2017/050,865, filed Aug. 30, 2017 entitled "WIRELESS DEVICE FOR DETERMINING A BEST ANTENNA BEAM AND METHOD THEREOF," the entirety of which is incorporated herein by reference.

TECHNICAL FIELD

The present disclosure relates to a wireless device for a wireless communication system. Furthermore, the present disclosure also relates to corresponding, methods, computer programs, computer program products and carrier.

BACKGROUND

In wireless communication systems, information is transmitted wirelessly between the different wireless devices of the system. For example, information may be transmitted downlink, (DL) from a network node such as a base station (BS) to a wireless device such as a user equipment (UE) or, or uplink (UL) from the wireless device to the network node. The information may be both data and control information, and different physical layer channels may be used for carrying the information depending on whether the transmission is uplink or downlink, and whether the information contains data information, control information or a combination of both.

To meet the traffic demands in future wireless communication systems, new frequency bands are being considered, for example in the range of 30-100 GHz. These bands offer wide spectrum for high data rate communications, however, the coverage range is limited because of the system and channel characteristics. A promising technology to overcome the range limitations is based on multiple-input, multiple-output, MIMO, beam forming, where a best antenna beam is selected having beam forming weights. With the appropriate transmit and receive strategies, the antenna gain offered by the arrays as an antenna beam can substantially improve the coverage range. This strategy is called beam forming which allows the transmitted power to focus on privileged directions thereby increasing the gain. Previous works on beam forming include using fixed codebooks, comprising predefined antenna beams, and choosing the best beam pair (V, U) for a transmitter TX and a receiver RX that achieves best performance, e.g. as described in 1. Noh, Song, Michael D. Zoltowski, and David J. Love. "Multi-resolution codebook and adaptive beam forming sequence design for millimeter wave beam alignment." (2015). Since directional beams are considered, the best TX and RX beams pair (V, U) is given by aligned beams more commonly known as beam alignment, see e.g. J. Song, J. Choi, and D. J. Love, "Codebook design for hybrid beam forming in millimeter wave systems," in Proc. IEEE Int. Conf. on Commun., London, UK, Jun. 2015. See also Zhou, Shengli, and Georgios B. Giannakis. "Optimal transmitter eigen-beam forming and space-time block coding based on channel mean feedback." IEEE Transactions on Signal Processing 50.10 (2002): 2599-2613. This method is used to avoid estimating the channel directly when a very large numbers of TX and RX antenna elements are considered. Direct channel estimation of the channel between the transmitter TX and the receiver RX is costly since the number of channel parameters can be large. Beam alignment methods often involve an exhaustive search over all possible antenna beam pairs to find the best antenna beam pair for transmission. Due to high-resolution codebooks in communications, this search can be computationally costly. Previous work has been done in finding faster ways to perform this alignment by exploiting system and channel characteristics to derive complex searching algorithms. Multi-level and multi-resolution codebooks have also been investigated to focus the direction of the beams even more to achieve better performance, see e.g. Noh et. al. above. It is important to distinguish between the beam forming at the TX side and at the RX side. First we look at the transmitter beam forming. Let x(i) be the symbol transmitted at time i. At the TX, if we consider uniform linear antennas (ULA), the following beamformed signal is transmitted beam forming is used to transmit $$W_i^{tx*}x(i),$$

where $W_i^{tx}$ is the ($N_t \times 1$) TX antennas weight vector, used for beam forming. $N_t$ indicates the number of transmit antennas. Now we look at the receiver. Let y(i) be the symbol sampled received signal vector ($N_r \times 1$) at time i, $$y(i)=HW_{i_{tx}}^{t*}x(i)+n(i),$$

where n(i) is the ($N_r \times 1$) noise vector sampled at time i. At the RX, the ($N_r \times 1$) antennas weight vector) $W_i^{rx}$ defining the RX beam forming, is used. $N_r$ indicates the number of receive antennas. The received signal can then be expressed as $$\hat{y}(i)=W_i^{rx*}y(i)$$

We can select the beam forming vectors from a set of predefined beams, e.g. select from a codebook or by performing a singular value decomposition, SVD, of the channel matrix. Transmission using the optimal beam pair (V, U) is possible by performing an SVD of the channel matrix (H=USV*) and choosing the beam forming vectors as the first column vector in matrix V and the first column of matrix U for the TX and RX sides respectively, see Zhou et. al. By choosing these values for our beam forming vectors we find the best rank 1 approximation of the channel and therefore the SNR is maximized. This is true if only one transmitter beam and one receiver beam is used. More formally, $W_t^{tx}=v_1(i)$ and $W_t^{rx*}=u_1(i)$, where t is a time index. This method requires no fixed codebook (predefined beams) because it gives us our optimal beam forming vector straight away.

Conventional beam alignment methods often involve an exhaustive search over all possible pairs (V,U) to find the best beams for transmission based on some measure, for example the signal-to-noise ratio (SNR). Due to high-resolution codebooks in communications, this search can be computationally very costly to be performed at every time instant. Previous work has been done in finding faster ways to perform this alignment by exploiting system and channel characteristics to derive complex searching algorithms. Multi-level and multi-resolution codebooks, have also been investigated to focus the direction of the beams even more to achieve better performance.

Thus there is a need to provide a solution which mitigates or solves the described drawbacks and problems, such as to mitigate the need to perform a search at every time instant. In particular when large antenna arrays are involved at both the TX and RX sides.

SUMMARY

An objective of embodiments of the invention is to provide a solution which mitigates or solves the drawbacks and problems described above. The above and further objectives are achieved by the subject matter described herein. Further advantageous embodiments or implementation forms of the invention are also defined herein.

The above and further objectives are achieved by the subject matter described herein. Further advantageous implementation forms of the invention are further defined herein.

According to a first aspect of the invention, the above mentioned and other objectives are achieved with a method for use in a wireless node for determining a best antenna beam. The method comprises obtaining a training model, wherein the training model has been trained to provide a best antenna beam based on a plurality of feedback values, determining a first plurality of feedback values indicative of partial estimates of channels of a first plurality of wireless signals and determining a best antenna beam, based on the first plurality of feedback values and the obtained training model.

At least an advantage of the invention according to reduce computational complexity by eliminating the need to perform an exhaustive search through all of the antenna beams to find the best antenna beam at every transmission time instant.

According to a second aspect of the invention, the above mentioned and other objectives are achieved with a wireless device configured to operate in a wireless communication system and configured for determining a best antenna beam.

The advantages of the second aspect are the same as for the first aspect.

Further applications and advantages of embodiments of the invention will be apparent from the following detailed description.

Figure 1:
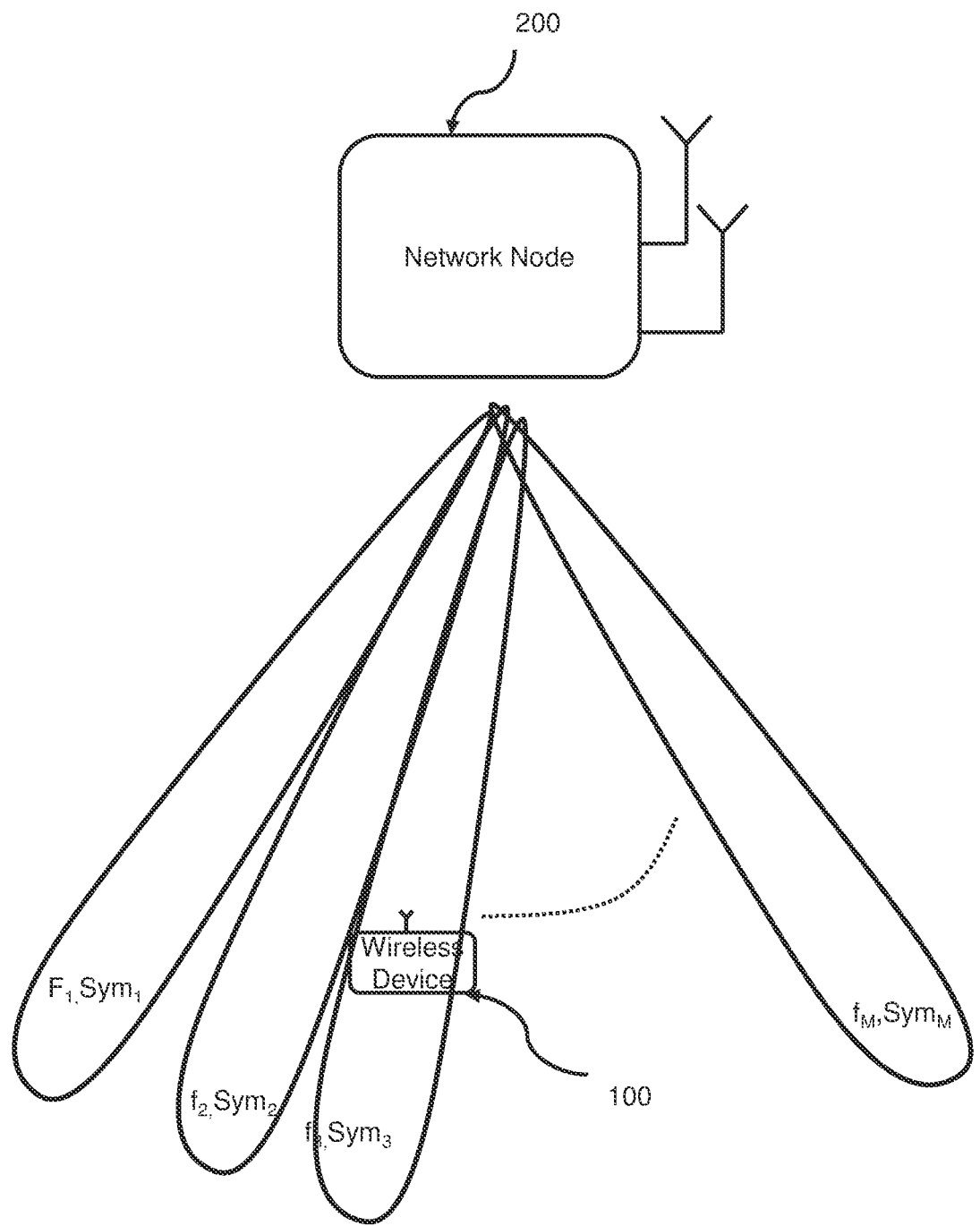
FIG. 1 illustrates antenna beams covering a cell area according to one or more embodiments of the present disclosure.

A more complete understanding of embodiments of the invention will be afforded to those skilled in the art, as well as a realization of additional advantages thereof, by a consideration of the following detailed description of one or more embodiments. It should be appreciated that like reference numerals are used to identify like elements illustrated in one or more of the figures.

DETAILED DESCRIPTION

In some embodiments herein a term wireless device is used and it can correspond to any type of wireless device or wireless communication network node, which communicates with other wireless devices, such as a user equipment, UE, a network node or any other wireless communications network node. In some embodiments the non-limiting term user equipment (UE) is used interchangeably with wireless device and refers to any type of wireless device communicating with a network node or with another UE in a cellular, mobile communication system or wireless communication network. Examples of a UE are a target device, a device to device (D2D) UE, a machine type UE or a UE capable of machine to machine (M2M) communication, a PDA, a PAD, a Tablet, a mobile terminal, a smart phone, a laptop embedded equipped (LEE), a laptop mounted equipment (LME), a USB dongle, a ProSe UE, a V2V UE, a V2X UE, a MTC UE, a eMTC UE, a FeMTC UE, a UE Cat 0, a UE Cat M1, a narrow band Iot (NB-IoT) UE, a UE Cat NB1, etc.

In some embodiments herein a further term "network node" is used and it can correspond to any type of wireless device or wireless communication network node, which communicates with other wireless devices, such as a user equipment, UE, a network node or any other wireless communications network node. Examples of network nodes are NodeB, MeNB, SeNB, gNB, a network node belonging to MCG or SCG, base station (BS), multi-standard radio (MSR) radio node such as MSR BS, eNodeB, network controller, radio network controller (RNC), base station controller (BSC), relay, donor node controlling relay, base transceiver station (BTS), access point (AP), transmission points, transmission nodes, RRU, RRH, nodes in distributed antenna system (DAS), core network node (e.g. MSC, MME, etc), O&M, OSS, SON, positioning node (e.g. E-SMLC), MDT, test equipment, etc.

The embodiments herein are described for LTE based systems such as MTC, eMTC, NB-IoT etc. As an example MTC UE, eMTC UE and NB-IoT UE also called as UE category 0, UE category M1 and UE category NB1. However the embodiments are applicable to any RAT or multi-RAT systems, where the UE receives and/or transmit signals (e.g. data) e.g. LTE FDD/TDD, WCDMA/HSPA, GSM/GERAN, Wi Fi, WLAN, CDMA2000, 5G, NR/NX, etc.

The term signal or wireless signal used herein can be a physical signal or it can be a physical channel. A physical signal does not contain higher layer information whereas a physical channel contains higher layer information or data. Examples of physical signals are CRS, SRS, DMRS, PRS, MBSFN RS, CSI-RS etc. Examples of physical channels are data channel or physical data channels (e.g. PDSCH, sPDSCH, NPDSCH, PUSCH, sPUSCH, NPUSCH etc), control channel or physical control channel. Examples of control channel are PDCCH, sPDCCH, NPDCCH, MPDCCH, PUCCH, NPUCCH, sPUCCH, RACH, NRACH, ePDCCH, PBCH. NPBCH etc.

The term physical resource may comprise of a time resource and/or a frequency resource. The term time resource used herein may correspond to any type of physical resource or radio resource expressed in terms of length of time. Examples of time resources are: symbol, time slot, sub frame, radio frame, TTI, interleaving time, special sub frame, UpPTS, short TTI (sTTI), short sub frame (SSF) etc.

The term a frequency resource used herein may correspond to any type of physical resource or radio resource expressed in terms of frequency bandwidth. Examples of a physical resource are resource block (RB), physical RB (PRB), virtual RB (VRB), resource element (RE) etc. The embodiments described herein may apply to any RRC state, e.g., RRC_CONNECTED or RRC_IDLE. The UE may operate under either normal coverage or enhanced coverage with respect to a cell e.g. serving cell, neighbor cell, reference cell etc. The enhanced coverage is also interchangeably called as the extended coverage. The UE may also operate in a plurality of coverage levels e.g. normal coverage, enhanced coverage level 1, enhanced coverage level 2, enhanced coverage level 3 and so on. In case of extended/enhanced coverage, the UE may be capable of operating under lower signal quality level (e.g. SNR, SINR, ratio of average received signal energy per subcarrier to total received power per subcarrier (Ês/Iot)), RSRQ etc) compared to its capabilities when operating in legacy systems. The coverage level enhancement may vary with the operational scenario and may also depend on the UE type, UE capability or UE receiver capability. For example, a UE which is located in a basement with bad coverage or radio conditions may need larger level of coverage enhancement (e.g. 20 dB) compared to a UE which is at a cell border (e.g. −3 dB). The coverage level may be expressed in terms of received signal quality and/or received signal strength at the UE with regards to its serving cell or received signal quality and/or received signal strength at the serving cell with regards to the UE. The coverage level of the UE or coverage enhancement (CE) level may also be defined with respect to any cell such as a neighbor cell. For example in terms of received signal quality and/or received signal strength at the UE with regards to a target cell on which it performs one or more radio measurements. The term "configured to" may be used interchangeably with "adapted to" or "operative to" in the disclosure herein. The term "memory" may be used interchangeably with "computer readable medium" or "non-transitory computer readable medium" in the disclosure herein. The term "learning mode" may be used interchangeably with "learning phase" or "training mode" or "training phase" in the disclosure herein.

The term "best antenna beam" may be used interchangeably with "preferred antenna beam" or "antenna beam for an upcoming transmission" or "optimal antenna beam" in the disclosure herein. The expression "best antenna beam" is to be interpreted as an antenna beam that, when used in a transmission of a wireless signal and/or reception of a wireless signal, provides the best or preferred properties of a wireless channel of the wireless signal and/or of the received wireless signal. The best or preferred properties may include signal strength/RSRP, channel quality/RSRQ . . . etc., and which would thus show the best quality or conditions for communication between two radio nodes TX and RX.

The disclosure herein uses machine learning, ML, to mitigate the need to perform a search at every time instant, e.g. every time instant for transmission of a wireless signal, by forming a prediction problem. Prediction of optimal beam forming weights to form beams to be used at the next transmission time instant is performed. To facilitate the feature extraction from the channel information, the invention uses a fixed codebook for the partial estimation of the channel as input to the learning architecture. The system is trained to generate the optimal or best beams at the next time instant given this partial channel estimation. In one embodiment of the disclosure this is based on the SVD of the channel matrix. Note that Full CSI knowledge may be used to generate the optimal or best beams that are used during learning, e.g. to determine a quality measure of the training model. During learning the system will learn to generate optimal or best beams using partial channel information as input to the learning mode, e.g. performed by a machine learning architecture. This means that during deployment it knows how to generate the optimal beams given partial channel input, that is for example fed back from the receiver. This method is used to mitigate the need to estimate the entire channel at each time instant which is very costly.

In summary, the disclosure can be seen as consisting of three main parts:

A method and apparatus configured to train the learning algorithm, at least using a codebook F of fixed beams.

A method and apparatus configured to generate optimal or best beams given partial information from the channel/partial estimates of channel.

A method and apparatus configured to recover from prediction errors to ensure reliability of the invention.

Embodiments of the present disclosure has as least the advantage that a fixed codebook is not required during transmission of data. This allows for flexibility in terms of beam forming shapes of antenna beams. The antenna beams can be dynamically tailored to the specific environment.

Embodiments of the present disclosure has as least the advantage to reduce computational complexity by avoiding direct channel estimation. Direct channel estimation is computationally very costly when there are many antenna elements at TX and RX. The present disclosure reduces computational complexity and mitigates this problem by learning to generate the optimal beam pair from partial channel information using a fixed codebook.

Embodiments of the present disclosure has as least the advantage to use a fixed codebook to transmit the training signal for partial estimation of the channel. This information may be fed back by the receiver and will provide useful feature extraction for the machine learning model.

Embodiments of the present disclosure has as least the advantage to transmit data using optimal or best antenna beams based on the SVD.

Embodiments of the present disclosure has as least the advantage to use machine learning to predict the optimal or best beams at the next time instant, thus reducing computational complexity by eliminating the need to perform an exhaustive search through all of the beams to find the best pair at every time instant.

Embodiments of the present disclosure has as least the advantage to use a supervised prediction model or training model that is a supervised learning method in the training phase or learning mode and an unsupervised (online) learning method in the data transmission mode. Several different machine learning techniques can be used to obtain the training model or prediction model, for example decision trees, random forests, neural networks, recurrent neural networks/long-short term memory etc. For the unsupervised (online) learning, simpler online methods can be used that update the weights of the prediction model based on the current time instant or more advanced reinforcement learning techniques that update the weights of the prediction model based on past and present time instances.

Important concepts of the disclosure include using a fixed codebook when sending the training sequence, for partial channel estimation, in combination of having no codebook to send the data using the optimal beams or best antenna beams. Further important concepts of the disclosure include performing prediction of the optimal beams or best antenna beams to mitigate the need to perform an exhaustive search at every time instant, e.g. every time instant when transmitting data. Further important concepts of the disclosure include removing the need of full channel estimation to design the best beams or best antenna beams.

The solution of the disclosure herein consists of several different parts: learning mode, transmission mode (trained system) and recovery mode to recover from prediction errors.

The disclosure involves having a fixed set of beams, e.g. in codebooks, at the TX and RX sides. It is important to understand that these codebooks are only used when sending a training sequence to get a partial channel estimate. We choose to estimate the channel using a fixed codebook because feature extraction from the channel information is difficult. The message signal itself is sent using the optimal beam forming vectors, $V_1$ at the TX side and $U_1$ at the RX side, based on the singular value decomposition SVD of the channel matrix H. By choosing these beam forming vectors ($V_1$ and $U_1$ we find the best rank 1 approximation of the channel H and therefore the SNR of the received wireless signal is maximized. This property is true if beams with a single main lobe are used, either at the transmitter and/or at the receiver side. For more general TX and RX architectures, better performance is possible using higher rank approximations of the channel H.

An example of the concept in the disclosure is explained in the example below. In the example a Rank 1 channel approximation, a receiver equipped with a single isotropic antenna, so no beam forming vector $U_1$ at the receiver, is used. I.e. the beam forming is done only at the transmitter or TX side. The proposed solution can easily be extended to the multi-antenna case with beam forming at the RX side.

FIG. 1 illustrates antenna beams covering a cell area according to one or more embodiments of the present disclosure.

A fixed codebook F is used at the TX side, e.g. at the network node 200, $F=\{f_1, f_2, \ldots f_M\}$. Each beam $f_m$ of the codebook can be identified by and index m=1, ..., M and covers a sector of the cell area. Each beam is also associated to a training symbol (or signature) $sym_m$, m=1, ..., M. Let us assume we know at time i the best antenna beam or optimal antenna beam shape (not based on a codebook) to be used for the channel H. According to the SVD of the channel H, the beam is defined by the vector (not based on a codebook) $v_1(i)$ to be used at the TX side. The goal is then used to predict $v_1(i+1)$.

Figure 2:
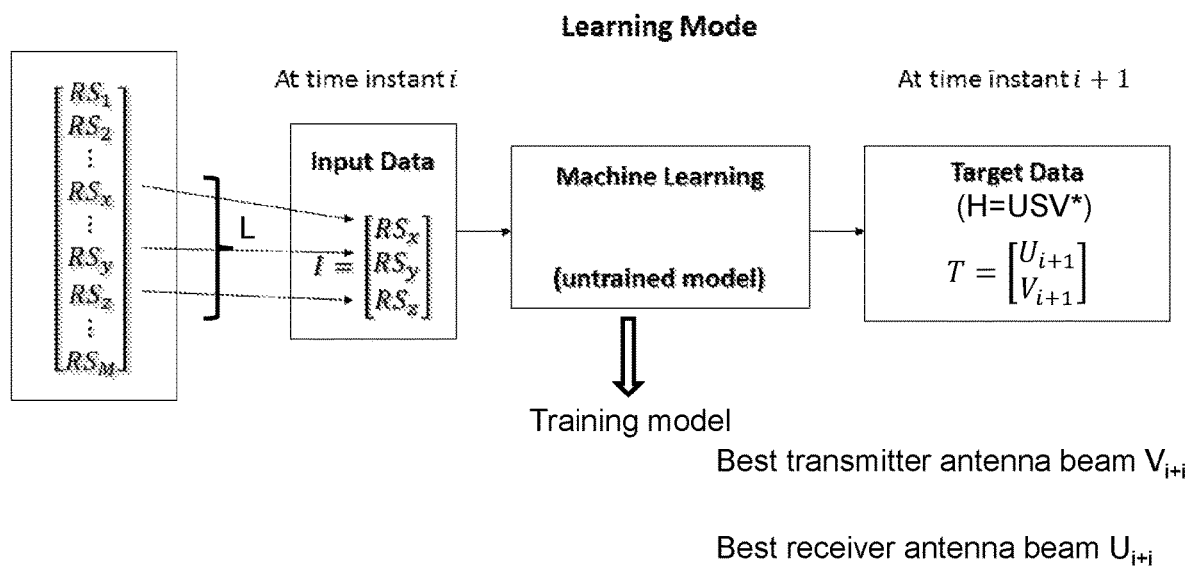
FIG. 2 illustrates a wireless device operating in learning mode according to one or more embodiments of the present disclosure.

FIG. 2 illustrates a wireless device 100 operating in learning mode according to one or more embodiments of the present disclosure. During the learning mode or training phase, when the training model is obtained, the following steps are repeated for each time instant:

The network node 200, e.g. a base station, BS, acting as a transmitter, sweeps amongst all the beams $f_m$ of the fixed codebook $F=\{f_1, f_2, \ldots f_M\}$, by transmitting the training symbols (or signatures) $SYM=\{sym_1, sym_2, \ldots, sym_M\}$. FIG. 1 shows the network node 200 sweeping of the sector with M beams, each antenna beam associated to a training symbol or signature SYM.

The UE feedbacks feedback values comprising partial channel information, e.g. partial estimates of the channels. In the following sections, to be compliant to the LTE definition, we refer to reference signals/symbols for each received signal. This is only an example and it can be any combination of Channel Quality Information CQI, Precoding Matrix Indicators PMI, Rank Indicator RI or an SNR value or another kind of partial channel information. After this step we have then a vector or a plurality of feedbacks $[RS_1, RS_2, \ldots RS_M]$ for each transmitted reference symbol $SYM=\{sym_1, sym_2, \ldots, sym_M\}$.

The number L highest feedback values, or best feedback values in the sense of the channel H, are selected from this plurality of values, vector or array. This array/vector is sorted and passed along as input for the learning phase. The sorted plurality of values in the vector; corresponding to the L best beams to be used from the fixed codebook F, and in descending order the second best the third best etc., are the partial channel information or partial channel estimates used as input for the learning mode. Partial channel estimates will also be used later during data transmission mode, i.e. when the training model is trained. The number L values passed as input during the learning mode, can be determined or decided depending on the information we want then to use later during the data transmission mode or phase. In the present example the number L is fixed at L=3. Note that selecting the number L highest feedback values is only one example of possible feature extraction from the channel, e.g. using the L highest feedback values as input to for the learning phase. There are many other possibilities, for examples using the highest feedback value along with its neighboring antenna beam values. The invention is thus not limited to using the L highest feedback values.

During the learning mode, we may assume full channel knowledge, so that the SVD of the channel matrix can be computed and the beam forming vectors or weights $v_1(i+1)$ (and $u_1(i+1)$ if beam forming is considered also at the receiver side) can be derived.

We repeat these steps several times until the ML model is trained and thus learns how to generate the beam forming vectors or antenna weights $v_1(i+1)$ and/or $u_1(i+1)$, if beam forming is considered also at the receiver side, using the available partial channel information or partial channel estimate as input. I.e. determined the best antenna beam based on the L feedback values from the RS vector, without the full knowledge of the channel. In other words, the system learns how to couple the partial channel information or partial channel estimate with the generation/determination of optimal or best beams. Once the system is trained, the online phase or the data transmission mode or phase can be initiated.

Figure 3:
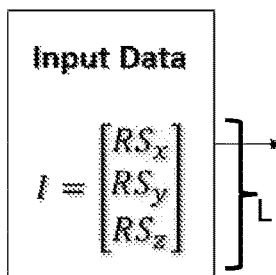
FIG. 3 illustrates a wireless device operating in data transmission mode according to one or more embodiments of the present disclosure.
Figure 3:
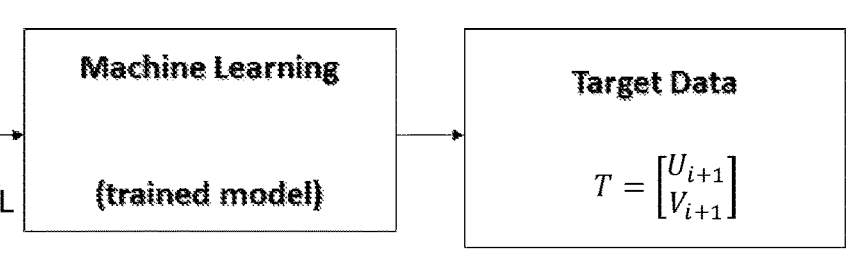

FIG. 3 illustrates a wireless device operating in data transmission mode according to one or more embodiments of the present disclosure. In the transmission phase, illustrated in FIG. 3, given the fixed codebook $F=\{f_1, f_2, \ldots f_M\}$, and previously determined best antenna beam v(i), the method of the disclosure may comprise these steps:

1) We compute the inner products, $\alpha_m=|v(i)*f_m^*|$ for m=1, ..., M and where ($f_m^*$ represents the complex conjugate of $f_m$) and we order them according to one or more ranking-criteria, e.g. order them in the decreasing order $\alpha_x > \alpha_y > \alpha_z$.

2) We select the L feedback values with the highest ranking, e.g. the largest ones, and transmit the corresponding training symbols as $f_x s_x, f_y s_y, f_z s_z, \ldots$. It is important to notice that in this stage we do not need to perform the exhaustive sweeping to select the L beams from the fixed codebook to be used for the training sequence transmission but we just perform the inner product and select the L highest ranked feedback values. In a further example, the L feedback values with the highest ranking are selected by selecting the highest ranking antenna beam and L−1 of its neighboring antenna beams.

The UE receives the training symbols as $f_x s_x$, $f_y s_y$, $f_z s_z$, ... and feedbacks the corresponding feedback values or reference signals [$RS_x$, $RS_y$, $RS_z$], similarly to what is done in the learning phase. This information or feedback values are used as input to the learning architecture or the learning mode which will gives as output the optimal beam forming vector or best antenna beam $v_1(i+1)$ and/or $u_1(i+1)$ if also beam forming at the receiver side is considered.

By using fixed antenna beams to transmit the training symbols we may get a partial estimate of the channel. In this way we do not need the full channel knowledge. This has the advantage of solving the feature extraction problem aiming to find relevant channel information. As mentioned previously, many different feature extraction methods (combination of feedback values) can be used and therefore the invention is not limited to a single one.

In the data transmission mode we use previously determined optimal beam forming vector estimates or best antenna beams to compute the inner products to find the best antenna beams for the partial channel estimate.

In some situations, the disclosed method for determining the best antenna beams may degrade in performance e.g. can spiral out of control for many time instances. To solve this problem, a third phase or mode called "recovery phase" is defined. The recovery mode is further described in relation to FIG. 9. This phase or mode is fundamental for ensuring the reliability of the proposed disclosure. By keeping track of the ACK/NACK sent by the receiver RX, we can ensure that the system does not deviate from a sufficient performance in antenna beams estimation. If the blocks were received correctly, we can assume the system is estimating sufficiently good beams for transmission. If we start to receive several NACKs, we perform an exhaustive search to find the best fixed antenna beams to perform the channel estimate with.

Figure 4:
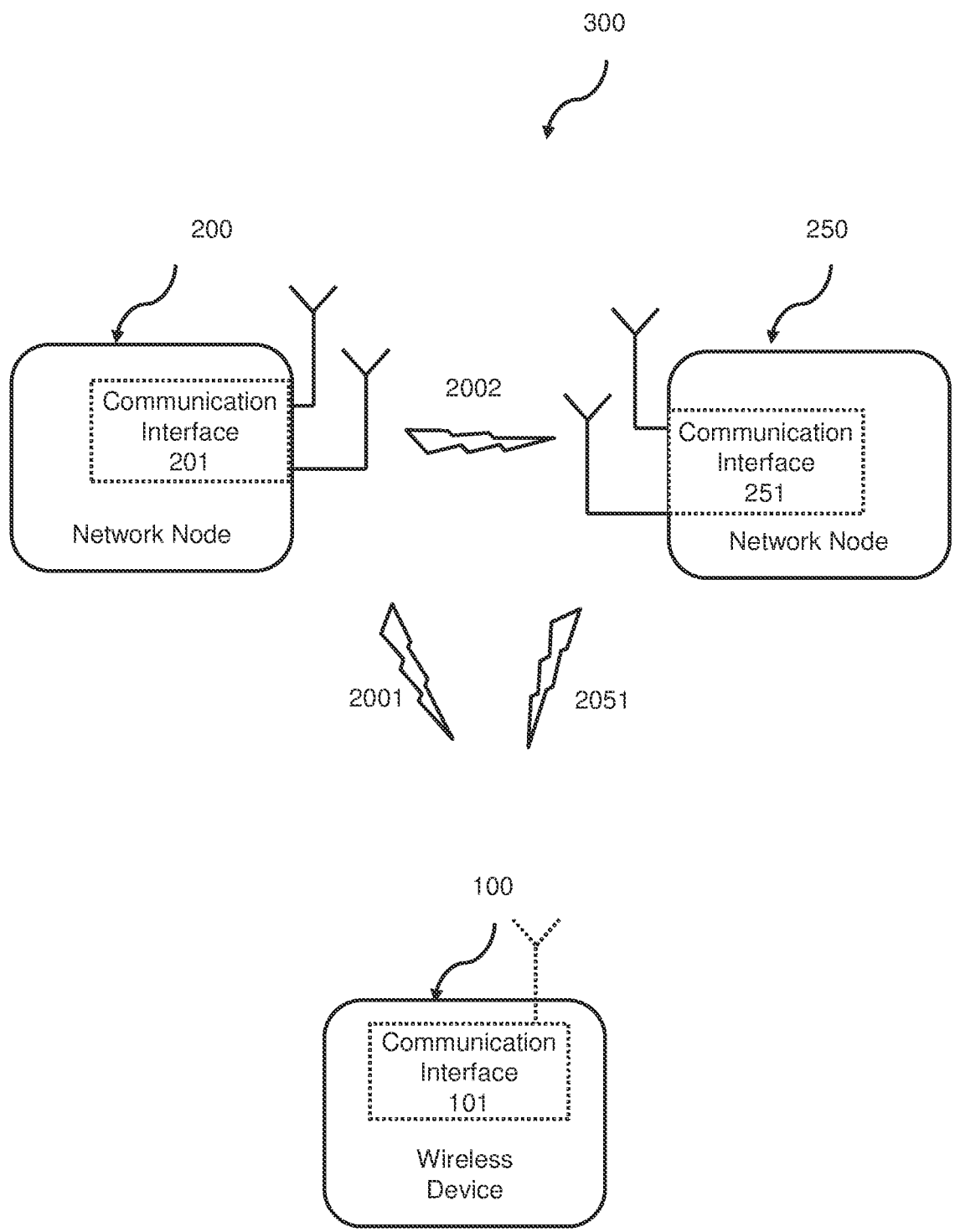
FIG. 4 shows a wireless communication system according to one or more embodiments of the present disclosure.

FIG. 4 shows a wireless communication system 300 according to one or more embodiments of the present disclosure. The wireless communication system 300 may comprise radio nodes, e.g. in the form of a wireless device 100, a network node 200 and a training network node 250. In one example, the wireless device 100 may be a UE, the network node 200 may be a base station and the training network node 250 may be a server. One or more of the radio nodes may perform some or all of the functionality described herein. Any distribution of the functionality or method steps described herein between wireless device 100, a network node 200 and a training network node 250 may be envisioned. The first a wireless device 100 may comprise a communications interface 101, e.g. a transceiver 104, and is configured to configured to transmit or receive wireless signals. The network node 200 may comprise a communications interface 201, e.g. a transceiver, and is configured to configured to transmit or receive wireless signals, e.g. to transmit or receive on the same or different bandwidths. The network node 200 may further comprise a plurality of transceivers, also grouped together and referred to as cells herein, which transceivers may be configured to transmit or receive on the same or different bandwidths. The training network node 250 may comprise a communications interface 251, e.g. one or more transceivers, and is/are configured to transmit or receive wireless signals, e.g. to transmit or receive on the same or different bandwidths.

The network node 200 may be configured and/or operative to transmit/receive wireless signals 2001 to/from the wireless device 100 and/or to transmit/receive wireless signals 2002 to/from the training network node 250, e.g. within the total set of radio resources or the transmission BW of the network node 200. The training network node 250 may be configured and/or operative to transmit/receive wireless signals 2501 to/from the wireless device 100, e.g. within the total set of radio resources or the transmission BW of the training network node 250, and/or to transmit/receive wireless signals 2002 to/from the network node 200. The wireless device 100, the network node 200 or the training network node 250 may use any suitable radio access technology RAT, as defined above. The wireless device 100 may be configured to transmit a wireless signal using an antenna beam V, e.g. defined by beam forming weights, and/or to receive a wireless signal using an antenna beam U, typically also defined by beam forming weights. The network node 200 may be configured to transmit a wireless signal using the antenna beam V, e.g. defined by beam forming weights, and/or to receive a wireless signal using the antenna beam U. The training network node 250 may be configured to transmit and/or receive one or more wireless signals.

Figure 5:
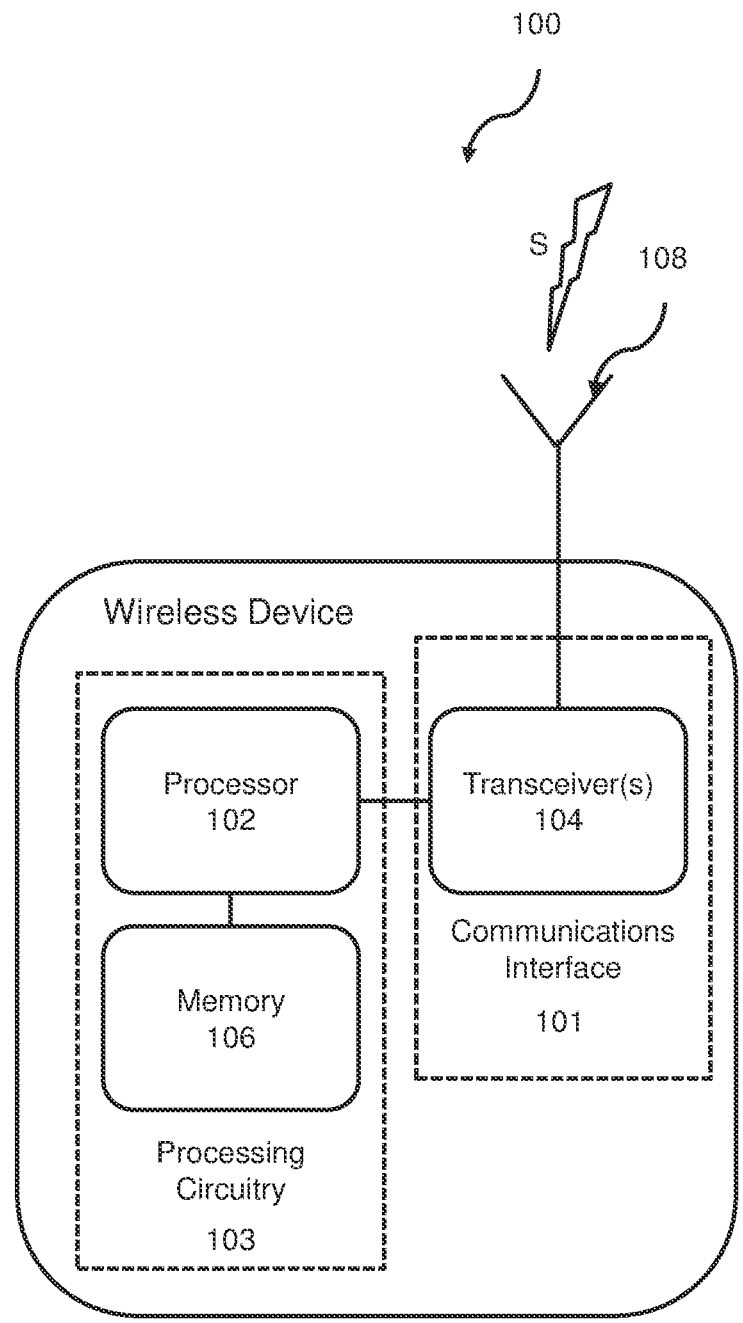
FIG. 5 show a wireless device configured for communication or to operate in a wireless communication system according to one or more embodiments of the present disclosure.

FIG. 5 show a wireless device 100 configured for communication or to operate in a wireless communication system 300 according to one or more embodiments of the present disclosure. The wireless device 100 comprises processing circuitry 103. The processing circuitry 103 may comprise a processor 102, and a memory 106, said memory 106 containing instructions executable by said processor, whereby said first wireless device 100 is operative to perform the method of any of the embodiments described herein. The processor 102 is communicatively coupled to a communications interface 101, comprising one or more transceivers 104. The communications interface 101 is operative to receive information, such as control information or data information, from the processor 102 and generate a wireless signal S for a wireless communication system or to receive the wireless signal S for a wireless communication system, demodulate and/or decode the wireless signal S to information and send to the processor 102. Further, the wireless device 100 may further comprise one or more optional antennas 108, as shown in FIG. 5. The antenna/s 108 is/are coupled to the transceiver/s 104 and is/are configured to transmit/emit or receive wireless signals S for a wireless communication system, e.g. transmit control information or data information included in the wireless signals S. The processor and/or a processor unit may be, e.g. processing circuitry and/or a central processing unit and/or processor modules and/or multiple processors configured to cooperate with each-other. The memory 106 may comprise of essentially any suitable memory, such as a ROM (Read-Only Memory), a PROM (Programmable Read-Only Memory), an EPROM (Erasable PROM), a Flash memory, an EEPROM (Electrically Erasable PROM), or a hard disk drive. The processor 102 may be communicatively coupled to any or all of the transceiver 104 and the memory 106.

The network node 200 may comprise all or a selection of features of the wireless device as described in relation to FIG. 5.

The training network node 250 may comprise all or a selection of features of the wireless device as described in relation to FIG. 5.

Figure 6:
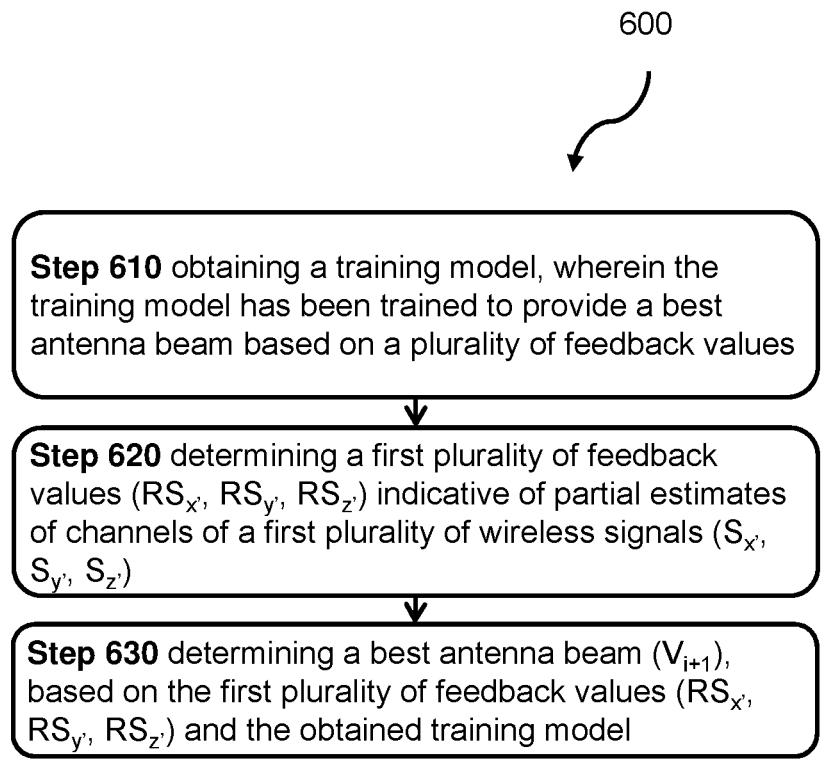
FIG. 6 shows a flowchart of a method 600 for determining a best antenna beam according to one or more embodiments of the present disclosure.

In an embodiment shown in relation to FIG. 6, the method disclosed herein is defined to perform low computational complexity beam forming in data transmission mode. As mentioned previously, the embodiment has at least the advantage to reduce computational complexity by eliminating the need to perform an exhaustive search through all of the beams in a codebook F to find the best antenna beam V/U or best antenna beam pair (V, U) at every time instant for transmission of a wireless signal This is achieved by using a training model that uses machine learning to predict the optimal or best beam/s at the next time instant.

FIG. 6 shows a flowchart of a method 600 for determining a best antenna beam according to one or more embodiments of the present disclosure. The method 600 may be implemented in the wireless device 100, the network node 200 or the training network node 250 or any combination thereof. The method comprises:

STEP 610: obtaining a training model, wherein the training model has been trained to provide a best antenna beam based on a plurality of feedback values. The best antenna beam typically comprises beam forming weights, e.g. comprised in a beam forming vector.

Obtaining the training model may be performed by retrieving the training model from the memory, by receiving the training model comprised in control signaling from another wireless device or by training the training model using machine learning techniques such as decision trees, random forests, neural networks, recurrent neural networks/long-short term memory etc.

In one example, the training model is obtained by training the training model using machine learning techniques performed in a UE, performed in a network node 200 or performed in a training network node 250. In a further example, the training model is obtained by receiving a wireless signal $S_{model}$ comprising the training model in a UE from a network node 200 or from a training network node 250. In a further example, the training model is obtained by receiving a wireless signal $S_{model}$ comprising the training model in a network node 200 from a UE or from a training network node 250. The wireless signal $S_{model}$ may be any suitable control signal.

STEP 620: determining a first plurality of feedback values $RS_{x'}$, $RS_{y'}$, $RS_{z'}$ indicative of partial estimates of channels of a first plurality of wireless signals ($S_{x'}$, $S_{y'}$, $S_{z'}$). The wireless signals ($S_{x'}$, $S_{y'}$, $S_{z'}$) typically comprises unique reference signals/symbols/sequences SYM={$sym_1$, $sym_2$, ..., $sym_M$} for each wireless signal and the partial estimates of channels of the wireless signals ($S_{x'}$, $S_{y'}$, $S_{z'}$) may be based on the reference symbols. Examples of feedback values are Channel Quality Information CQI, Precoding Matrix Indicators PMI, Rank Indicator RI or an SNR value or another kind of partial channel information. The first plurality of feedback values $RS_{x'}$, $RS_{y'}$, $RS_{z'}$ may comprise any combination of these exemplary feedback values.

In one example, the first plurality of feedback values $RS_{x'}$, $RS_{y'}$, $RS_{z'}$ may be determined by performing measurements in a receiving wireless device 100 RX, e.g. a UE. In one further example, the first plurality of feedback values $RS_{x'}$, $RS_{y'}$, $RS_{z'}$ may be determined by performing measurements in a receiving wireless device 100 RX, e.g. a UE, and transmitting the feedback values $RS_{x'}$, $RS_{y'}$, $RS_{z'}$ as a control signal to a transmitting wireless device 100, e.g. the network node 200 or the training network node 250. In one further example, the first plurality of feedback values $RS_{x'}$, $RS_{y'}$, $RS_{z'}$ may be determined by performing measurements in a receiving wireless device 100 RX, e.g. the network node 200 or the training network node 250. In one further example, the first plurality of feedback values $RS_{x'}$, $RS_{y'}$, $RS_{z'}$ may be determined by performing measurements in a receiving wireless device 100 RX, e.g. a network node 200, and transmitting the feedback values $RS_{x'}$, $RS_{y'}$, $RS_{z'}$ as a control signal to a training wireless device 100, e.g. a training network node 250.

Step 630: determining a best antenna beam ($V_{i+1}$), based on the first plurality of feedback values ($RS_{x'}$, $RS_{y'}$, $RS_{z'}$) and the obtained training model. Determining the best antenna beam ($V_{i+1}$) may e.g. be performed by providing a plurality of feedback values, e.g. ($RS_{x'}$, $RS_{y'}$, $RS_{z'}$), and a corresponding set of antenna beams, e.g. ($f_x$, $f_y$, $f_z$), as input to the obtained training model and receive the best antenna beam, e.g. ($V_{i+1}$), as output from the obtained training model.

In one example, the best antenna beam is determined in the wireless device, such as a UE. In one further example, the best antenna beam is determined in the network node 200 and signaled as a control signal to the wireless device to be used for transmission of a wireless signal. In one further example, the best antenna beam is determined in the training network node 250 and signaled as a control signal to the UE to be used for transmission of a wireless signal. The best antenna beam may be signaled directly to the UE from the training network node 250 or via the network node 200.

In one embodiment, the method 600 further comprises controlling 640 transmission of a first wireless signal $S_{i+1}$ using the best antenna beam $V_{i+1}$.

Figure 7:
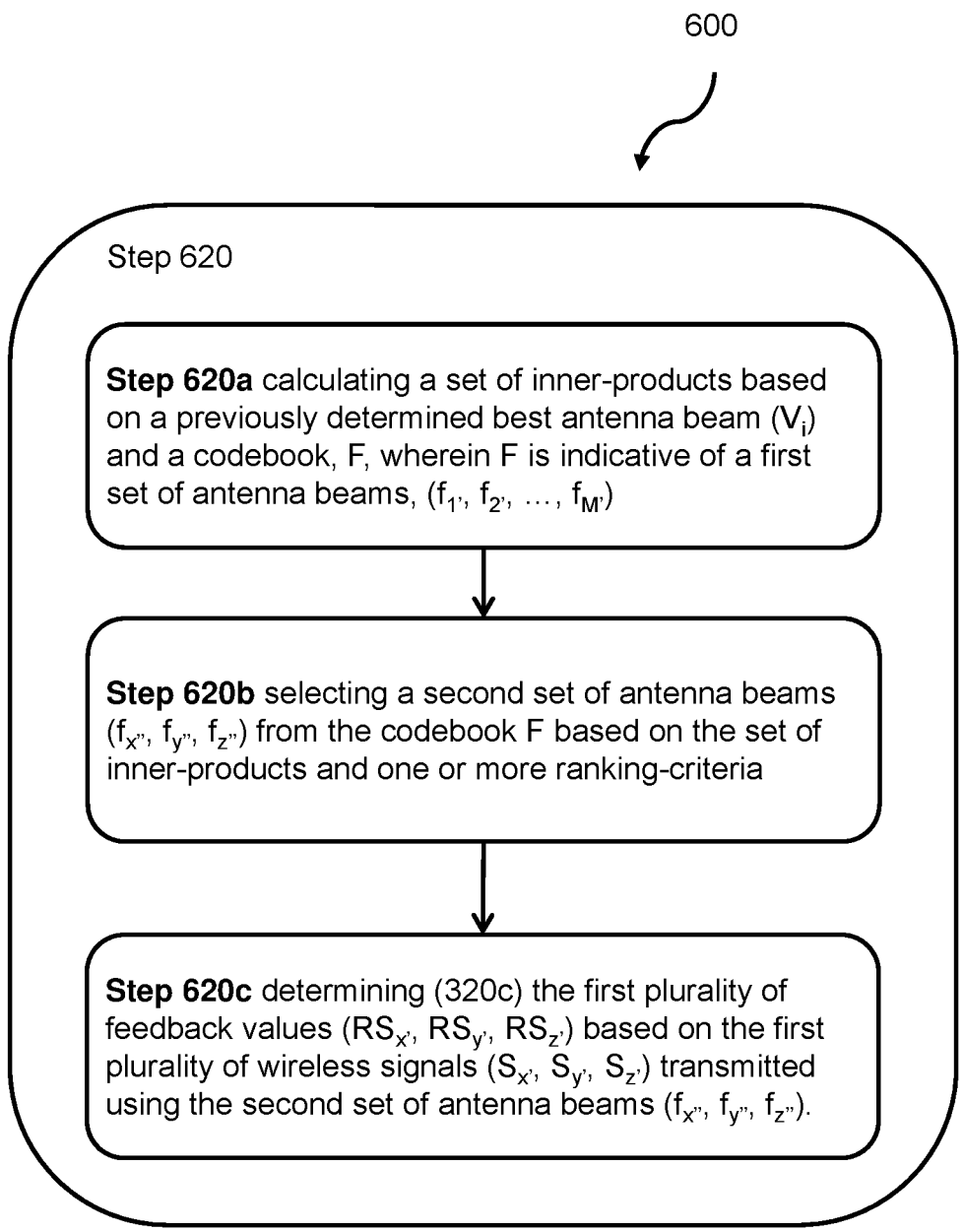
FIG. 7 shows details of a flowchart of the method 600 for determining a best antenna beam according to the present disclosure.

A further detailed embodiment of a wireless device 100 operating in data transmission mode is described in relation to FIG. 7. This embodiment has at least the advantage that partial estimates of the channels of the plurality of transmitted wireless signals $S_{x'}$, $S_{y'}$, $S_{z'}$ are obtained by using fixed beams in the codebook F to transmit the training symbols. In this way, the full channel knowledge is not required. This further mitigates or solves the feature extraction problem to find and extract relevant channel information. Further, the first plurality of feedback values $RS_{x'}$, $RS_{y'}$, $RS_{z'}$ is determined based on a set of antenna beams selected from the codebook F based on a calculation of an inner product of the latest determined best antenna beam $V_i$ and the codebook F.

FIG. 7 shows details of a flowchart of the method 600 for determining a best antenna beam according to the present disclosure. The step of determining 620 the first plurality of feedback values $RS_{x'}$, $RS_{y'}$, $RS_{z'}$ further comprises the steps of:

STEP 620a: calculating a set of inner-products based on a previously determined best antenna beam $V_i$ and a codebook, F, wherein F is indicative of a first set of antenna beams, $f_{1'}$, $f_{2'}$, ..., $f_{M'}$. Each of the of antenna beams, $f_{1'}$, $f_{2'}$, ..., $f_{M'}$ may comprise beam forming weights.

Calculating a set of inner-products is further described in relation to FIG. 3. The codebook F may be any suitable predetermined codebook comprising beam forming vectors and/or beam forming weights.

STEP 620b: selecting a second set of antenna beams $f_{x''}$, $f_{y''}$, $f_{z''}$ from the codebook F based on the set of inner-products and one or more ranking-criteria. In one example, the ranking-criteria involves selecting a number L antenna beams from the codebook F that have the highest or greatest corresponding calculated inner-products of all the inner-products calculated in step 620a. In a further example, the L feedback values with the highest ranking is selected by selecting the highest ranking antenna beam and L−1 of its neighboring antenna beams, e.g. the antenna beams closest in the codebook or the antenna beams that are spatially closest.

STEP 620c: determining the first plurality of feedback values $RS_{x'}$, $RS_{y'}$, $RS_{z'}$ based on the first plurality of wireless signals $S_{x'}$, $S_{y'}$, $S_{z'}$ transmitted using the second set of antenna beams $f_{x''}$, $f_{y''}$, $f_{z''}$.

In one example, three antenna beams $f_{x''}$, $f_{y''}$, $f_{z''}$ are selected from all the antenna beams comprised in the codebook F. The transmitter TX, e.g. the network node 200, transmits three wireless signals $S_{x'}$, $S_{y'}$, $S_{z'}$ using the selected three antenna beams $f_{x''}$, $f_{y''}$, $f_{z''}$. The UE then determines feedback values $RS_{x'}$, $RS_{y'}$, $RS_{z'}$ as further described in relation to method step 620, as would be understood by a person skilled in the art. The UE may then use the determined feedback values $RS_{x'}$, $RS_{y'}$, $RS_{z'}$ to determine a best antenna beam or to send the determined feedback values $RS_{x'}$, $RS_{y'}$, $RS_{z'}$ comprised in a control signal to the network node 200 and/or to the training network node 250. The network node 200 or the training network node 250 may then use the feedback values $RS_{x'}$, $RS_{y'}$, $RS_{z'}$ received in the control signal to determine a best antenna beam.

Figure 8:
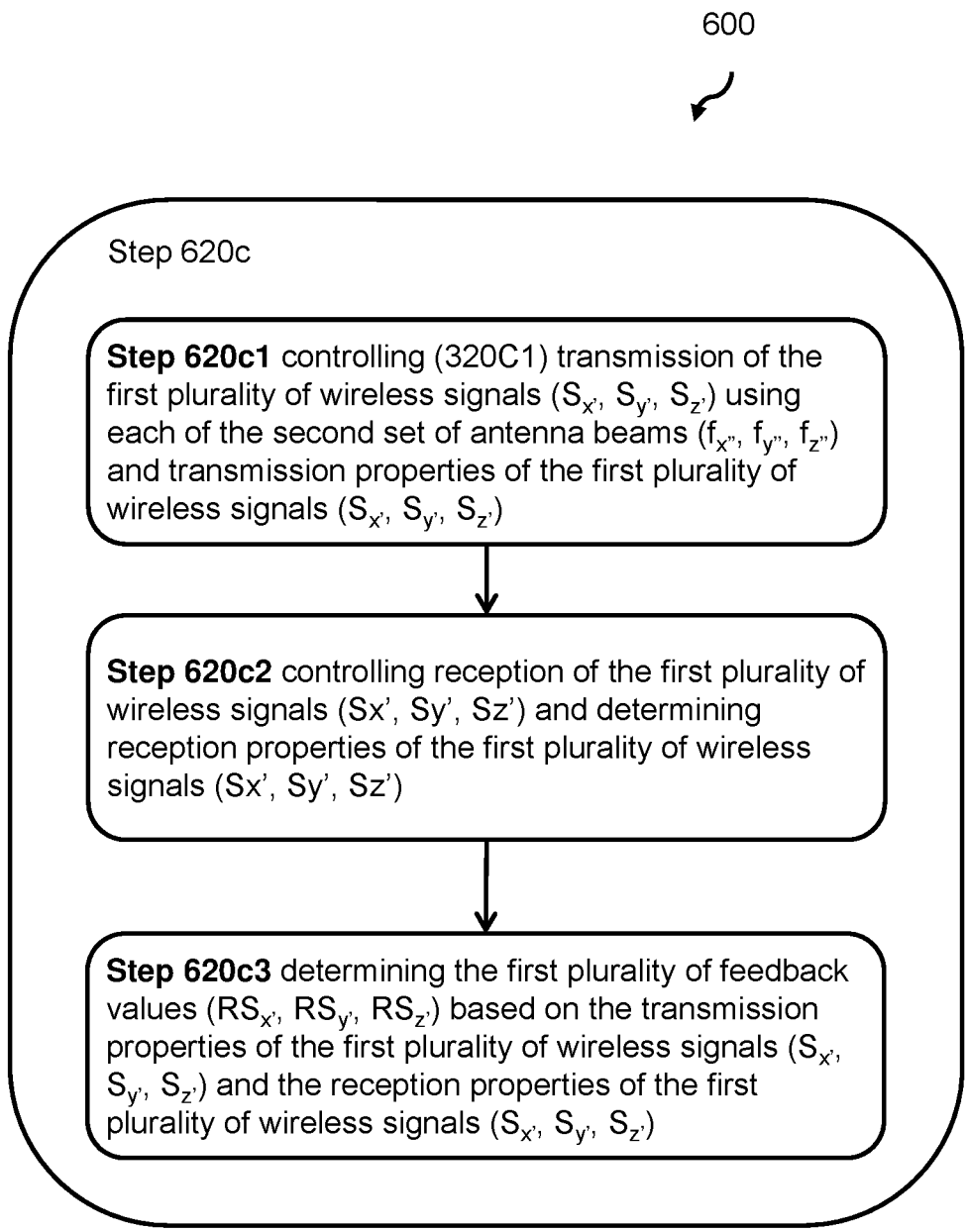
FIG. 8 shows details of a flowchart of the method 600 for determining a best antenna beam according to the present disclosure.

A further detailed embodiment of a wireless device 100 operating in data transmission mode is described in relation to FIG. 8. This embodiment has at least the same advantages as described in relation to FIG. 7.

FIG. 8 shows details of a flowchart of the method 600 for determining a best antenna beam according to the present disclosure. The step of STEP 620c: determining the first plurality of feedback values $RS_{x'}$, $RS_{y'}$, $RS_{z'}$ further comprises the step of:

Step 620c1: controlling transmission of the first plurality of wireless signals $S_{x'}$, $S_{y'}$, $S_{z'}$ using each of the second set of antenna beams $f_{x''}$, $f_{y''}$, $f_{z''}$. Further, transmission properties, e.g. predetermined transmission properties, of the first plurality of wireless signals $S_{x'}$, $S_{y'}$, $S_{z'}$ may be used to control the transmission, e.g. transmission power of each of the first plurality of wireless signals ($S_{x'}$, $S_{y'}$, $S_{z'}$).

In one example, the UE controls transmission of the first plurality of wireless signals $S_{x'}$, $S_{y'}$, $S_{z'}$ after performing step 620b, selecting a second set of antenna beams, by sending a control signal to the network node 200 or the training network node 250, thereby triggering the transmission of the first plurality of wireless signals $S_{x'}$, $S_{y'}$, $S_{z'}$. In one further example, the network node 200 controls transmission of the first plurality of wireless signals $S_{x'}$, $S_{y'}$, $S_{z'}$ after performing step 620b, selecting a second set of antenna beams, by transmitting the first plurality of wireless signals $S_{x'}$, $S_{y'}$, $S_{z'}$.

STEP 620c2: controlling reception of the first plurality of wireless signals $S_{x'}$, $S_{y'}$, $S_{z'}$ and determining reception properties of the first plurality of wireless signals $S_{x'}$, $S_{y'}$, $S_{z'}$. Reception properties may include signal strength or signal quality measures.

In one example, the UE controls reception of the first plurality of wireless signals $S_{x'}$, $S_{y'}$, $S_{z'}$ by receiving the first plurality of wireless signals $S_{x'}$, $S_{y'}$, $S_{z'}$. The UE may further determine the signal strength of each wireless signal.

In one further example, the network node 200 controls reception of the first plurality of wireless signals $S_{x'}$, $S_{y'}$, $S_{z'}$ by configuring measurements by the UE. The UE may further determine a measurement result, e.g. the signal strength or a signal quality measure, of each wireless signal and send a control signal comprising the results of the configured measurements to the network node 200.

STEP 620c3: determining the first plurality of feedback values $RS_{x'}$, $RS_{y'}$, $RS_{z'}$ based on the transmission properties of the first plurality of wireless signals $S_{x'}$, $S_{y'}$, $S_{z'}$ and the reception properties of the first plurality of wireless signals $S_{x'}$, $S_{y'}$, $S_{z'}$.

In one example, the UE or the network node 200 determines the first plurality of feedback values $RS_{x'}$, $RS_{y'}$, $RS_{z'}$ based on the transmission and reception properties, e.g. any combination of Channel Quality Information CQI, Precoding Matrix Indicators PMI, Rank Indicator RI or an SNR value or another kind of partial channel information.

In one embodiment, the first set of antenna beams $f_{1'}$, $f_{2'}$, ..., $f_{M'}$ comprises a first number, M, of antenna beams and the second set of antenna beams $f_{x''}$, $f_{y''}$, $f_{z''}$ comprises a second number, L, of antenna beams wherein L<M. This embodiment has the advantage that computational complexity is reduced by operating on a subset of the antenna beams in the codebook F.

In one embodiment, each of the first plurality of wireless signals $S_{x'}$, $S_{y'}$, $S_{z'}$ comprises a unique training symbol $Sym_{x'}$, $Sym_{y'}$, $Sym_{z'}$.

Figure 9:
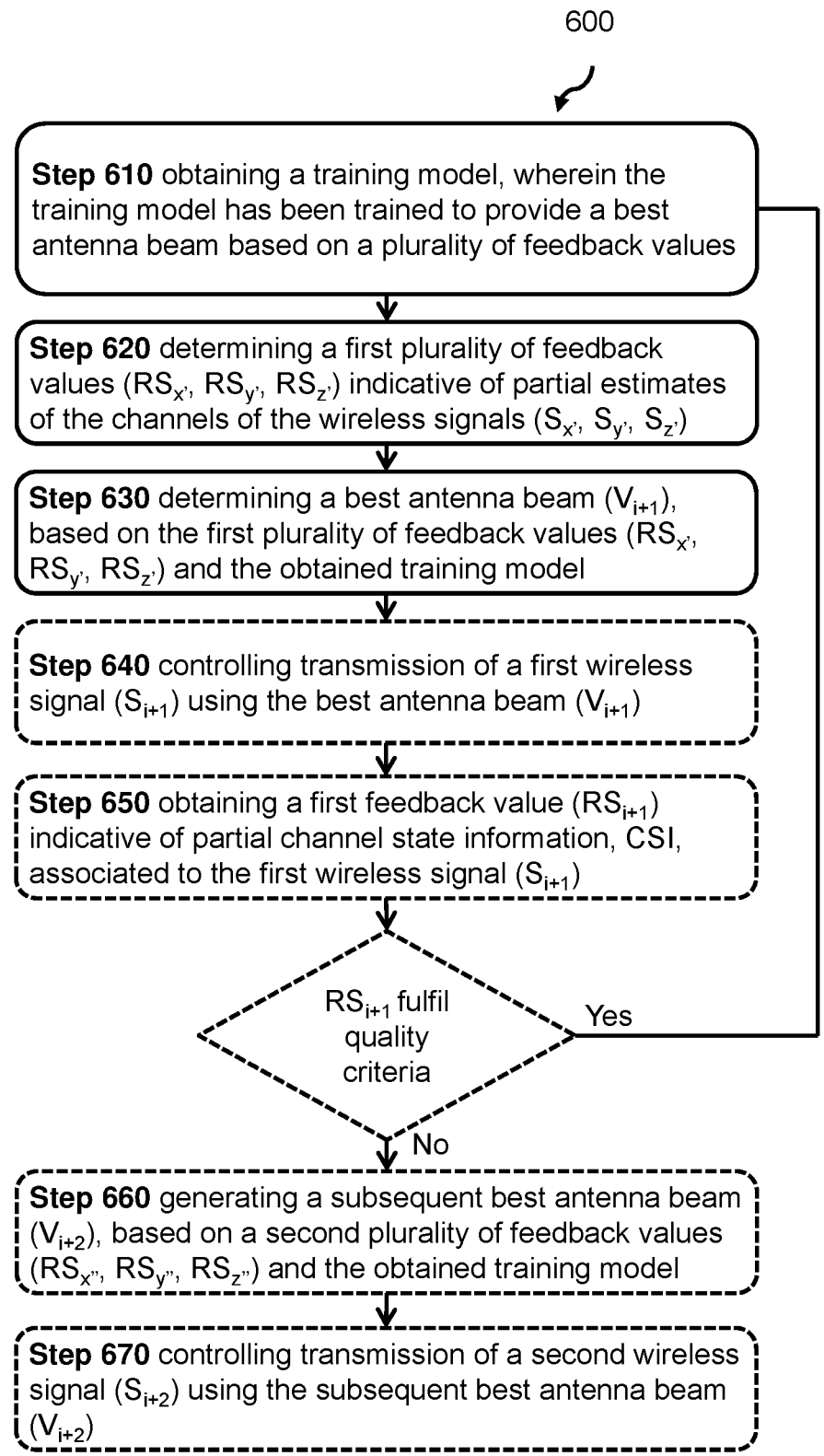
FIG. 9 shows of a flowchart of the method 600 for determining a best antenna beam according to one or more embodiments of the present disclosure.

FIG. 9 shows of a flowchart of the method 600 for determining a best antenna beam according to one or more embodiments of the present disclosure.

The method may comprise an optional STEP 640 of controlling transmission of a first wireless signal $S_{i+1}$ using the best antenna beam $V_{i+1}$, as further described in relation to FIG. 6.

In some situations, the disclosed method for determining the best antenna beams may degrade in performance, thus the reliability of the proposed invention disclosure may not be ensured. The present disclosure therefore provides a method that includes a recovery mode. In an embodiment, the method further comprises the steps:

STEP 650: obtaining a first feedback value $RS_{i+1}$ indicative of a partial estimate of a channel of the first wireless signal $S_{i+1}$.

It is further checked if the first feedback value $RS_{i+1}$ fails to fulfill one or more wireless signal quality criteria. In one example, the wireless signal quality criteria may include signal strength being above a predefined threshold or a signal quality measure being above a predefined threshold. In one further example, the wireless signal quality criteria may include a number of Acknowledgement of correctly received (ACK) messages or a number of incorrectly received messages (NACK) being above/below one or more predefined thresholds.

If the first feedback value $RS_{i+1}$ fails to fulfill the one or more wireless signal quality criteria, the method 600 further performs the following steps:

STEP 660: generating a subsequent best antenna beam $V_{i+2}$, based on a second plurality of feedback values $RS_{x''}$, $RS_{y''}$, $RS_{z''}$ and the obtained training model.

STEP 670: controlling transmission of a second wireless signal $S_{i+2}$ using the subsequent best antenna beam $V_{i+2}$.

In an embodiment, the step 660 further comprises the steps:

determining a third plurality of feedback values $RS_{1'''}$, $RS_{2'''}$, ..., $RS_{M'''}$ indicative of partial estimates of channels of a third plurality of wireless signals $S_{1'''}$, $S_{2'''}$, ..., $S_{M'''}$ transmitted using each antenna beam of a codebook, F, wherein F is indicative of a first set of antenna beams, $f_{1'}$, $f_{2'}$, ..., $f_{M'}$.

selecting the second plurality of feedback values $RS_{x''}$, $RS_{y''}$, $RS_{z''}$ from the third plurality of feedback values $RS_{1'''}$, $RS_{2'''}$, ..., $RS_{M'''}$ based on one or more feedback ranking-criteria. The feedback ranking-criteria may be the same as previously described, e.g. selecting the number L highest or largest values. In a further example, selecting the L feedback values by selecting the highest ranking antenna beam and L-1 of its neighboring antenna beams, e.g. the antenna beams closest in the codebook or the antenna beams that are spatially closest.

As described further in relation to FIG. 6, the training model may be obtained by training the training model using machine learning techniques.

In an embodiment, obtaining the training model is performed by:
  obtaining a codebook, F, wherein F is indicative of a first set of antenna beams, $(f_1, f_2, \ldots, f_M)$, and
  determining a fourth plurality of feedback values $(RS_{1''''}, RS_{2''''}, \ldots, RS_{M''''})$ indicative of partial estimates of channels of a fourth plurality of wireless signals $(S_{1''''}, S_{2''''}, \ldots, S_{M''''})$ transmitted using each antenna beam indicated by F,
  selecting a fifth plurality of feedback values $(RS_{x''''}, RS_{y''''}, RS_{z''''})$ from the fourth plurality of feedback values $(RS_{1''''}, RS_{2''''}, \ldots, RS_{M''''})$ based on one or more feedback ranking-criteria,
  train a model to provide a best antenna beam by using machine learning based at least on the fifth plurality of feedback values $(RS_{x''''}, RS_{y''''}, RS_{z''''})$ and a corresponding set of antenna beams.

Figure 10:
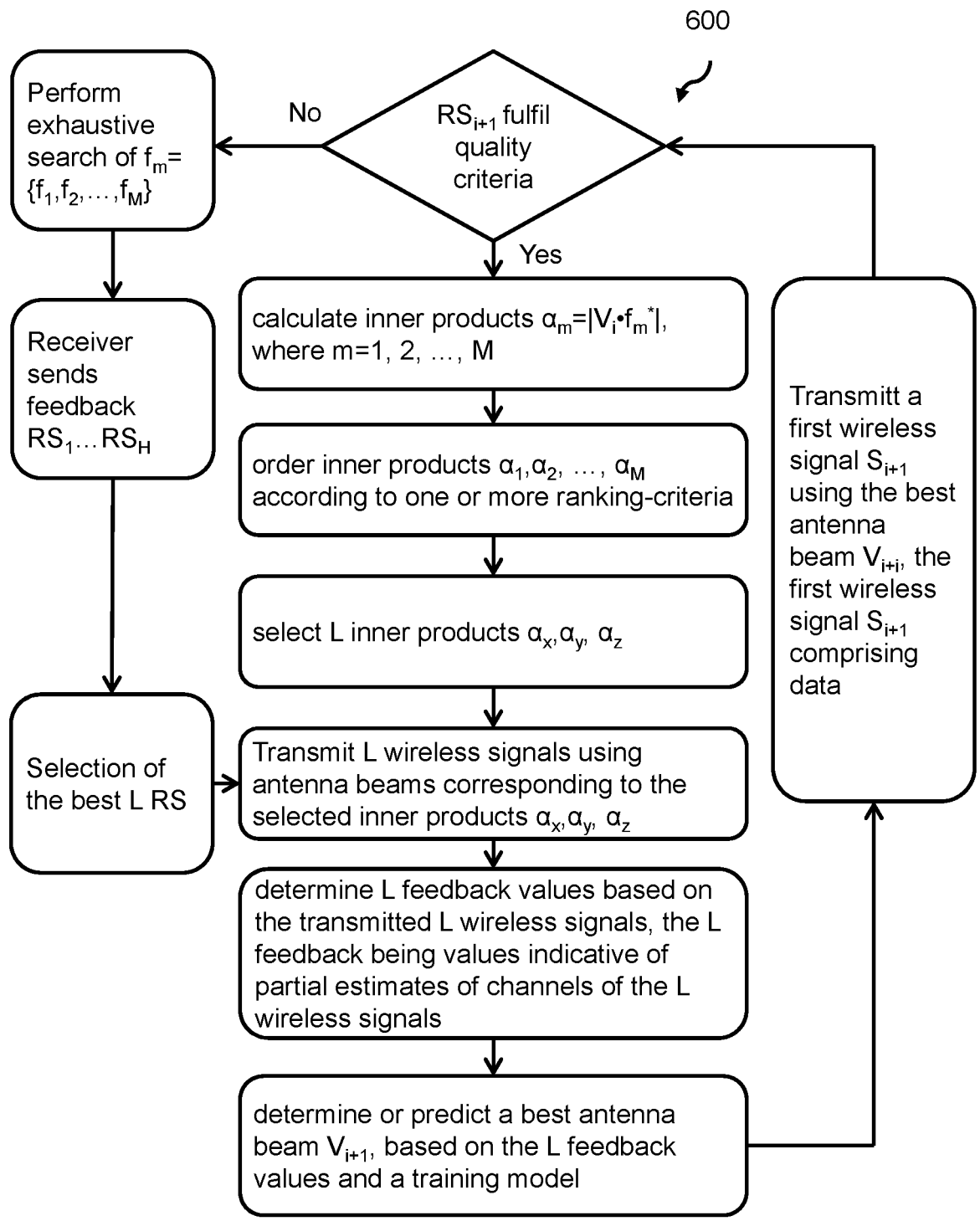
FIG. 10 shows of a flowchart of the method 600 for determining a best antenna beam according to one or more embodiments of the present disclosure.

FIG. 10 shows of a flowchart of the method 600 for determining a best antenna beam according to one or more embodiments of the present disclosure. In FIG. 10 the data transmission mode as well as the recovery mode are illustrated in a flowchart. The method begins by sending a training sequence to get a partial estimate of the channel. We pick the m largest fixed beams and transmit the training symbols with them. This is done by performing the inner products $\alpha_M = |v(i)*f^*_m|$ for $m=1, \ldots, M$ and ordering them according the description in the previous section. We transmit the training symbols. If the response is received correctly, we send this as input to the trained machine learning model. This will give us a prediction of the optimal beams that we then send our message signal with. As long as we get ACKs that everything was sent correctly, we continue in the same fashion. However, if we begin getting NACKs, we need to perform an exhaustive search to find the strongest fixed beams to send the training sequence with.

In an embodiment, a wireless node (100, 200, 250) is provided for determining a best antenna beam, the wireless node (100, 200, 250):
  an obtaining unit for obtaining a training model, wherein the training model has been trained to provide a best antenna beam based on a plurality of feedback values. The best antenna beam may comprise beam forming weights.
  a first determining unit for determining a first plurality of feedback values $(RS_x, RS_y, RS_z)$ indicative of partial estimates of channels of a first plurality of wireless signals $(S_x, S_y, S_z)$, a second determining unit for determining a best antenna beam $V_{i+1}$ based on the first plurality of feedback values $RS_x, RS_y, RS_z$ and the obtained training model.

In an embodiment, the first determining unit further comprises
  a first calculating unit for calculating a set of inner-products based on a previously determined best antenna beam $V_i$ and a codebook, F, wherein F is indicative of a first set of antenna beams, $f_1, f_2, \ldots, f_M$. Each of the of antenna beams $f_1, f_2, \ldots, f_M$ may comprise beam forming weights.
  a selecting unit for selecting a second set of antenna beams $f_{x''}, f_{y''}, f_{z''}$ from the codebook F based on the set of inner-products and one or more ranking-criteria, wherein the first determining unit determine the first plurality of feedback values $RS_{x'}, RS_{y'}, RS_{z'}$ based on the first plurality of wireless signals $S_{x'}, S_{y'}, S_{z'}$ transmitted using the second set of antenna beams $f_{x''}, f_{y''}, f_{z''}$.

In an embodiment, a computer program is provided and comprising computer-executable instructions for causing a wireless device or network node, when the computer-executable instructions are executed on circuitry, a processor or a processing unit comprised in the wireless device or network node, to perform any of the method steps described herein. The computer program is included in a computer readable medium of a computer program product. The computer readable medium may comprise of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

In an embodiment, a computer program product comprising a computer-readable storage medium, the computer-readable storage medium having the computer program described above embodied therein.

Furthermore, any methods according to embodiments of the disclosure may be implemented in a computer program, having code means, which when run by processing means causes the processing means to execute the steps of the method.

Moreover, it is realized by the skilled person that the wireless device 100, network node 200 and the training network node 250 may comprise the necessary communication capabilities in the form of e.g., functions, means, units, elements, etc., for performing the present solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the present solution.

The processor 102, e.g. of the present wireless device 100, comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the disclosure is not limited to the embodiments described above, but also relates to and incorporates all embodiments within the scope of the appended independent claims.

The invention claimed is:

1. A method for use in a wireless node for determining a best antenna beam, the method comprising:
  obtaining a training model, the training model having been trained to provide a best antenna beam based on a plurality of feedback values;
  determining a first plurality of feedback values indicative of partial estimates of channels of a first plurality of wireless signals; and determining a best antenna beam based on the first plurality of feedback values and the obtained training model.

2. The method according to claim 1, wherein determining the first plurality of feedback values further comprises:
calculating a set of inner-products based on a previously determined best antenna beam and a codebook, F, wherein F is indicative of a first set of antenna beams;
selecting a second set of antenna beams from the codebook F based on the set of inner-products and at least one ranking-criterion; and
determining the first plurality of feedback values based on the first plurality of wireless signals transmitted using the second set of antenna beams.

3. The method according to claim 2, wherein determining the first plurality of feedback values further comprises:
controlling transmission of the first plurality of wireless signals using each of the second set of antenna beams and transmission properties of the first plurality of wireless signals;
controlling reception of the first plurality of wireless signals and determining reception properties of the first plurality of wireless signals; and
determining the first plurality of feedback values based on the transmission properties of the first plurality of wireless signals and the reception properties of the first plurality of wireless signals.

4. The method according to claim 2, wherein
the first set of antenna beams comprises a first number, M, of antenna beams; and
the second set of antenna beams comprises a second number, L, of antenna beams,
wherein $L<M$.

5. The method according to claim 1, wherein each of the first plurality of wireless signals comprises a unique training symbol.

6. The method according to claim 1, the method further comprising:
controlling transmission of a first wireless signal using the best antenna beam.

7. The method according to claim 6, the method further comprising:
obtaining a first feedback value indicative of a partial estimate of a channel of the first wireless signal; and
if the first feedback value fails to fulfill at least one wireless signal quality criterion, further:
generating a subsequent best antenna beam, based on a second plurality of feedback values and the obtained training model; and
controlling transmission of a second wireless signal using the subsequent best antenna beam.

8. The method according to claim 7, wherein generating a subsequent best antenna beam further comprises:
determining a third plurality of feedback values indicative of partial estimates of channels of a third plurality of wireless signals transmitted using each antenna beam of a codebook, F, wherein F is indicative of a first set of antenna beams; and
selecting the second plurality of feedback values from the third plurality of feedback values based on at least one feedback ranking-criterion.

9. The method according to claim 7, wherein obtaining the training model is performed by receiving a third wireless signal comprising the training model.

10. The method according to claim 8, wherein obtaining the training model is performed by:
obtaining a codebook, F, wherein F is indicative of a first set of antenna beams, determining a fourth plurality of feedback values indicative of partial estimates of channels of a fourth plurality of wireless signals transmitted using each antenna beam indicated by F;
selecting a fifth plurality of feedback values from the fourth plurality of feedback values based on at least one feedback ranking-criterion; and
training a model to provide a best antenna beam by using machine learning based at least on the fifth plurality of feedback values and a corresponding set of antenna beams.

11. The method according to claim 1, wherein determining the best antenna beam comprises:
providing the first plurality of feedback values and a corresponding set of antenna beams as input to the obtained training model and receiving the best antenna beam as output from the obtained training model.

12. A wireless device, configured to operate in a wireless communication system and configured for determining a best antenna beam, the wireless device comprising:
a communication interface and
processing circuitry configured to cause the wireless device to:
obtain a training model, the training model having been trained to provide the antenna beam based on a plurality of feedback values;
determine a first plurality of feedback values indicative of partial estimates of channels of a first plurality of wireless signals; and
determine the best antenna beam, based on the plurality of feedback values and the obtained training model.

13. The wireless device according to claim 12, wherein the processing circuitry is configured to determine the first plurality of feedback values by further being configured to:
calculate a set of inner-products based on a previously determined best antenna beam and a codebook, F, wherein F is indicative of a first set of antenna beams;
select a second set of antenna beams from the codebook F based on the set of inner-products and at least one ranking-criterion; and
determine the first plurality of feedback values based on the first plurality of wireless signals transmitted using the second set of antenna beams.

14. The wireless device according to claim 13, wherein the processing circuitry is configured to determine the first plurality of feedback values by further being configured to:
control transmission of the first plurality of wireless signals using each of the second set of antenna beams and transmission properties of the first plurality of wireless signals;
control reception of the first plurality of wireless signals and determine reception properties of the first plurality of wireless signals; and
determine the first plurality of feedback values based on the transmission properties of the first plurality of wireless signals and the reception properties of the first plurality of wireless signals.

15. The wireless device according to claim 13, wherein
the first set of antenna beams comprises a first number, M, of antenna beams; and
the second set of antenna beams comprises a second number, L, of antenna beams,
wherein $L<M$.

16. The wireless device according to claim 12, wherein each of the first plurality of wireless signals comprises a unique training symbol.

17. The wireless device according to claim 12, wherein the processing circuitry is further configured to:
   control transmission of a first wireless signal using the best antenna beam.

18. The wireless device according to claim 17, wherein the processing circuitry is further configured:
   obtain a first feedback value indicative of a partial estimate of a channel of the first wireless signal; and
   if the first feedback value fails to fulfill at least one wireless signal quality criterion, further:
      generating a subsequent best antenna beam, based on a second plurality of feedback values and the obtained training model; and
      controlling transmission of a second wireless signal using the subsequent best antenna beam.

19. The wireless device according to claim 18, wherein the processing circuitry is configured to generate a subsequent best antenna beam by further:
   determining a third plurality of feedback values indicative of partial estimates of channels of a third plurality of wireless signals transmitted using each antenna beam of a codebook, F, wherein F is indicative of a first set of antenna beams; and
   selecting the second plurality of feedback values from the third plurality of feedback values based on at least one feedback ranking-criterion.

20. The wireless device according to claim 18, wherein the training model is obtained by receiving a third wireless signal comprising the training model.

21. The wireless device according to claim 19, wherein the processing circuitry is configured to obtain the training model by:
   obtaining a codebook, F, wherein F is indicative of a first set of antenna beams,
   determining a fourth plurality of feedback values indicative of partial estimates of channels of a fourth plurality of wireless signals transmitted using each antenna beam indicated by F;
   selecting a fifth plurality of feedback values from the fourth plurality of feedback values based on at least one feedback ranking-criterion; and
   training a model to provide a best antenna beam by using machine learning based at least on the fifth plurality of feedback values and a corresponding set of antenna beams.

22. The wireless device according to claim 12, wherein the processing circuitry is configured determine the best antenna beam by further being configured to:
   provide the first plurality of feedback values and a corresponding set of antenna beams as input to the obtained training model and receive the best antenna beam as output from the obtained training model.

23. The wireless device according to claim 12, wherein the wireless device is one of a user equipment, a network node and a training network node.

24. A non-transitory computer storage medium storing an executable computer program comprising computer-executable instructions for causing a wireless device, when the computer-executable instructions are executed on a processing unit comprised in the wireless device, to perform a method for determining a best antenna beam, the method comprising:
   obtaining a training model, the training model having been trained to provide a best antenna beam based on a plurality of feedback values;
   determining a first plurality of feedback values indicative of partial estimates of channels of a first plurality of wireless signals; and
   determining a best antenna beam based on the first plurality of feedback values and the obtained training model.

* * * * *